United States Patent
Ming et al.

(10) Patent No.: US 10,673,426 B2
(45) Date of Patent: Jun. 2, 2020

(54) SWITCH BOOTSTRAP CHARGING CIRCUIT SUITABLE FOR GATE DRIVE CIRCUIT OF GAN POWER DEVICE

(71) Applicant: University of Electronic Science and Technology of China, Chengdu (CN)

(72) Inventors: Xin Ming, Chengdu (CN); Li Hu, Chengdu (CN); Xuan Zhang, Chengdu (CN); Su Pan, Chengdu (CN); Chunqi Zhang, Chengdu (CN); Yao Qin, Chengdu (CN); Zhiwen Zhang, Chengdu (CN); Yangli Xin, Chengdu (CN); Zhuo Wang, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/455,803

(22) Filed: Jun. 28, 2019

(65) Prior Publication Data
US 2020/0052687 A1 Feb. 13, 2020

(30) Foreign Application Priority Data

Aug. 8, 2018 (CN) .......................... 2018 1 0896264
Aug. 15, 2018 (CN) .......................... 2018 1 0925805

(51) Int. Cl.
*H03K 17/06* (2006.01)
*H03K 17/16* (2006.01)
*H02M 3/07* (2006.01)

(52) U.S. Cl.
CPC ......... *H03K 17/063* (2013.01); *H03K 17/162* (2013.01); *H02M 3/07* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | | |
|---|---|---|---|---|
| 9,401,612 | B2* | 7/2016 | Kinzer | H01L 23/528 |
| 10,193,554 | B1* | 1/2019 | Sharma | H01L 27/0248 |
| 10,523,194 | B2* | 12/2019 | Raszka | H03K 17/145 |
| 2019/0058469 | A1* | 2/2019 | Yang | H03K 17/6871 |
| 2019/0089254 | A1* | 3/2019 | Op Het Veld | H02M 3/33569 |
| 2019/0123740 | A1* | 4/2019 | Chern | H02M 3/07 |

* cited by examiner

*Primary Examiner* — Cassandra F Cox
(74) *Attorney, Agent, or Firm* — Bayramoglu Law Offices LLC

(57) ABSTRACT

A switch bootstrap charging circuit suitable for a gate drive circuit of a GaN power device includes a high-voltage MOSFET, a low-voltage MOSFET, a high-voltage MOSFET control module, and a low-voltage MOSFET control module. The low-voltage MOSFET is a PMOS transistor, and the source of the low-voltage MOSFET is connected to the power supply voltage. The drain of the high-voltage MOSFET serves as an output terminal of the switch bootstrap charging circuit. The low-voltage MOSFET control module and the high-voltage MOSFET control module generate a gate drive signal of the low-voltage MOSFET and a gate drive signal of the high-voltage MOSFET according to the gate drive signal of the lower power transistor.

3 Claims, 7 Drawing Sheets

SWITCH BOOTSTRAP CHARGING CIRCUIT SUITABLE FOR GATE DRIVE CIRCUIT OF GAN POWER DEVICE

CROSS REFERENCE TO THE RELATED APPLICATIONS

This application is based upon and claims priority to Chinese Patent Application No. 201810925805.5, filed on Aug. 15, 2018, and Chinese Patent Application No. 201810896264.8, filed on Aug. 8, 2018, the entire contents of which are incorporated herein by reference.

TECHNICAL FIELD

The present invention belongs to the technical field of power management, and specifically relates to a switch bootstrap charging circuit suitable for a gate drive circuit of a GaN power device, which is particularly suitable for a gate drive circuit of gallium nitride (GaN) power devices in high-frequency and high-power-density applications.

BACKGROUND

With the development of power electronics in recent years, the half-bridge drive circuit is developing in the direction of high power density and high frequency, which puts forward new requirements for power transistor selection and circuit design. In the conventional half-bridge drive circuit, generally, silicon power transistors serve as the power stage. The solutions of the conventional silicon technique face a lot of challenges from the application requirements. In contrast, since the GaN power switch device (e.g. GaN high electron mobility transistor: GaN HEMT which is taken for example below) has excellent physical properties such as less gate charge Qg, high breakdown voltage, and requiring no reverse recovery time, the GaN power switch device is allowed to work under a higher switching frequencies with a higher efficiency for power conversion. Therefore, half-bridge gate drive circuit using the GaN power switch devices have excellent characteristics such as high speed, high power density, etc.

FIG. 1 and FIG. 5 show a conventional bootstrap charging circuit where Si power switch devices are applicable. The circuit charges the bootstrap capacitor $C_{boot}$ during the dead time and the on state of the lower power transistor, and supplies power to high-side gate driving during the on state of the upper power transistor. For a half-bridge gate drive circuit, the conventional bootstrap charging circuit is no longer suitable for the GaN power switch device as a floating power rail generating circuit. First, when the conventional bootstrap charging circuit works in the state of charging the bootstrap capacitor $C_{boot}$, the electric potential of the upper electrode plate of the bootstrap capacitor $C_{boot}$ approximates the internal power supply voltage VDD of the chip, and the electric potential of the lower electrode plate is the power switch node voltage SW. While, when the GaN HEMT is turned off and the current flows from the source to the drain, the drain-source voltage $V_{DS}$ will have a negative voltage ranging from −2 V to −3V. Therefore, in the half-bridge drive circuit, when the GaN HEMT is used as the low power transistor, a negative power stage bias voltage $V_{SW}$ may occur due to the sink current applied to the external load during the dead time. The higher the load current, the lower is the negative voltage, so that the bootstrap capacitor $C_{boot}$ may be overcharged to be much higher than the internal power supply voltage VDD of the chip, thus causing gate-source breakdown of the GaN power switch device. The gate-source breakdown voltage of GaN HEMT is relatively smaller, the VGS is required to be smaller than 6V, and the optimum drive voltage is equal to or less than 5.5V. Therefore, the conventional bootstrap charging circuit should be added with control to avoid charging of the bootstrap capacitor $C_{boot}$ during the dead time. Second, since GaN HEMTs are mostly used in high-voltage, high-frequency circumstances, the circuit requires high load carrying capacity for the bootstrap charging circuit and the bootstrap charging circuit should be able to be used for high frequency power supply in MHz range. However, the on-chip high-withstand-voltage fast-recovery power diode is difficult to be realized in the semiconductor process, and the performance of the fully integrated high-voltage power diode under high-frequency power supply will be seriously degraded due to the reverse recovery time and parasitic capacitance, which makes the conventional bootstrap charging circuit unable to fill up the consumed charges of the bootstrap capacitor $C_{boot}$ in time under the application requirements of high frequency and high power density, thereby affecting the voltage difference of the floating power rail BST relative to the switch node SW. Therefore, the performance of the high-side drive circuit is degraded, the switching loss of the upper power transistor is increased, and even the undervoltage protection is triggered to cause failure of the circuit.

Specifically, FIG. 5 shows a typical gate drive topology suitable for silicon power switch devices. The bootstrap capacitor $C_{boot}$ supplies power to the high-side drive circuit. The bootstrap capacitor $C_{boot}$ needs to be charged in the system to ensure that the upper power transistor MH can be normally turned on. In the conventional bootstrap charging circuit applied to silicon power devices, usually, the low-voltage power supply VDD is directly connected to the bootstrap diode $D_{boot}$ to charge the bootstrap capacitor $C_{boot}$. The charging mainly occurs in the dead time and the on state of the lower power transistor. When the bootstrap capacitor $C_{boot}$ is getting charged, the anode potential of the bootstrap capacitor $C_{boot}$ approximates to the internal power supply voltage VDD, and the cathode potential approximates to that of the switch node SW. During the dead time of the switch node SW, since the upper power transistor MH and the lower power transistor ML are turned off, the freewheeling current will flow from the source of the lower power transistor ML to the drain. For the case that the GaN HEMT device is used as the power stage, the voltage of the drain of the lower power transistor ML, i.e. the switching node SW, is dropped to a negative voltage value in a range from −2 V to −3 V. The larger the load current, the lower is the negative voltage, which leads to a voltage of the bootstrap capacitor $C_{boot}$ much higher than the internal power supply voltage VDD. Moreover, the gate-source breakdown voltage of the GaN HEMT is relatively smaller, and the gate-source voltage of the GaN HEMT should usually be limited within 5.5 V. Therefore, the excessive voltage of the bootstrap capacitor $C_{boot}$ will cause the gate and source breakdown of the GaN power transistor.

In addition, due to the application requirements of the GaN HEMTs, the gate drive circuit requires high load carrying capacity for the bootstrap charging circuit to meet the power supply in the applications of high frequency and high voltage, the conventional charging circuit using the high-voltage power diode $D_{boot}$ for charging is no longer suitable for high-frequency charging applications due to the limits of the high-voltage power diode $D_{boot}$. When the fully integrated high-voltage power diode $D_{boot}$ operates at high frequency, the reverse recovery effect thereof is more serious and the parasitic capacitance is larger, resulting in a severe degradation of the performance of the high-voltage power diode $D_{boot}$. Therefore, for the traditional bootstrap charging solution under the application requirements of high frequency and high power density, the charge of the bootstrap capacitor $C_{boot}$ is continuously consumed without being replenished in time, which causes an excessive low voltage on the bootstrap capacitor $C_{boot}$ and affects the high-side drive to not work normally. The results can range from the increase of switching loss of the upper power transistor to the failure of the power MOSFET.

SUMMARY

The prior art has the following disadvantages. When the above conventional bootstrap charging circuit is used as the floating power rail generating circuit of the GaN power switch device, the bootstrap capacitor $C_{boot}$ is overcharged due to the negative voltage existing in the dead time, thereby breaking down the GaN power switch device. And, the consumed charge of the bootstrap capacitor $C_{boot}$ cannot be replenished in time in the application of high frequency and high power density. To solve the above problems, the present invention provides a switch bootstrap charging circuit. In the switch bootstrap charging circuit, the bootstrap charging path is controlled to be turned on by a dual-MOSFET-switches structure, and the bootstrap charging circuit is avoided from charging the bootstrap capacitor $C_{boot}$ during the dead time, thereby preventing overvoltage on the bootstrap capacitor $C_{boot}$. Meanwhile, by replacing the bootstrap diode $D_{boot}$ in the conventional bootstrap charging circuit with the high-voltage metal-oxide-semiconductor field effect transistor (MOSFET), so as to be able to work at a higher frequency, the effect of the reverse recovery current and the additional loss caused by the reverse recovery can be eliminated, and the problem of performance degradation caused by overcurrent at the high frequency can be avoided. The high- and low-voltage MOSFETs are turned on only when the lower power transistor is turned on, which solves the problem of overcharging the bootstrap capacitor $C_{boot}$ due to the negative voltage at the power switch node SW during the dead time. In addition, the circuit can be shielded from the effect of common mode crosstalk of the switching node voltage when the high-side power switch is turned on, and the full on-chip integration of the circuit can be realized. The present invention is particularly suitable for the high-speed gate drive of the GaN power devices.

The technical solution of the present invention is as follows.

The present invention provides a switch bootstrap charging circuit suitable for a gate drive circuit of a GaN power device, in which a dual-MOSFET-switches structure, i.e. a high-voltage MOSFET and a low-voltage MOSFET, is provided. Moreover, a high-voltage MOSFET control module and a low-voltage MOSFET control module are combined to generate the gate drive signal of the low-voltage MOSFET and the gate drive signal of the high-voltage MOSFET which are controlled by specific logic to control the switching on or switching off of the high-voltage MOSFET and the low-voltage MOSFET. With such a configuration, under normal conditions, the high-voltage MOSFET and the low-voltage MOSFET are turned on and off almost at the same time when the low power transistor of the gate drive circuit of the GaN power devices is turned on or off, so that the bootstrap capacitor is controlled and gets charged during the time out of the dead time. Hereinafter, two solutions for two cases where the high-voltage MOSFET is a p-type metal-oxide-semiconductor (PMOS) transistor or an n-type metal-oxide-semiconductor (NMOS) transistor are described, and the specific structures of the corresponding high-voltage MOSFET control module and the low-voltage MOSFET control module are also described.

The case where the high-voltage MOSFET is an NMOS transistor is described below.

A switch bootstrap charging circuit suitable for a gate drive circuit of a GaN power device which includes an upper power transistor and a lower power transistor, includes a low-voltage MOSFET, a high-voltage MOSFET, a high-voltage MOSFET control module, and a low-voltage MOSFET control module. The low-voltage MOSFET is the first PMOS transistor, and the high-voltage MOSFET is the first NMOS transistor that can withstand a high drain-to-source (VDS) voltage.

The low-voltage MOSFET control module generates the first control signal and the gate drive signal of the low-voltage MOSFET according to the first undervoltage signal and the gate drive signal of the lower power transistor, wherein, the first undervoltage signal is an undervoltage protection signal generated when the power supply starts to work.

When the first undervoltage signal is at a low level, the first control signal and the gate drive signal of the low-voltage MOSFET are at a low level; when the first undervoltage signal is at a high level, the first control signal and the gate drive signal of the lower power transistor are at the same logic level, and the gate drive signal of the low-voltage MOSFET and the gate drive signal of the lower power transistor are at reverse logic levels.

The gate of the low-voltage MOSFET is connected to the gate drive signal of the low-voltage MOSFET, the source of the low-voltage MOSFET is connected to the power supply voltage, and the drain of the low-voltage MOSFET is connected to the source of the high-voltage MOSFET.

The high-voltage MOSFET control module includes the second NMOS transistor, the first inverter, the second inverter, the first capacitor, the second capacitor, and the first diode.

The input terminal of the first inverter is connected to the first control signal, and the output terminal of the first inverter is connected to the input terminal of the second inverter and is connected to the cathode of the first diode and the gate of the second NMOS transistor through the first capacitor.

The anode of the first diode and the source of the second NMOS transistor are connected to the power supply voltage.

The gate of the high-voltage MOSFET is connected to the drain of the second NMOS transistor and is connected to the output terminal of the second inverter through the second capacitor, and the drain of the high-voltage MOSFET serves as the output terminal of the switch bootstrap charging circuit.

The case where the high-voltage MOSFET is a PMOS transistor is described below.

A switch bootstrap charging circuit suitable for a gate drive circuit of a GaN power device which includes an upper power transistor and a lower power transistor includes a low-voltage MOSFET, a high-voltage MOSFET, a bootstrap capacitor, a high-voltage MOSFET control module, and a low-voltage MOSFET control module. The low-voltage MOSFET is a PMOS transistor, and the high-voltage MOSFET is a high-voltage PMOS transistor.

The source of the low-voltage MOSFET is connected to a power supply voltage, the drain of the low-voltage MOS- FET is connected to the drain of the high-voltage MOSFET, and the gate the low-voltage MOSFET is connected to the gate drive signal of the low-voltage MOSFET.

The gate of the high-voltage MOSFET is connected to the gate drive signal of the high-voltage MOSFET, and the source of the high-voltage MOSFET is connected to an upper electrode plate of the bootstrap capacitor and serves as an output terminal of the switch bootstrap charging circuit.

The lower electrode plate of the bootstrap capacitor is connected to the switch node of the gate drive circuit of the GaN power devices.

The low-voltage MOSFET control module is enabled by an enable signal to generate the gate drive signal of the low-voltage MOSFET under the control of the first low-side control signal. The gate drive signal of the low-voltage MOSFET and the first low-side control signal are at reverse logic levels. The first low-side control signal and the gate drive signal of the lower power transistor are at the same logic level. The enable signal and the first undervoltage signal are at the same logic level. The first undervoltage signal is an undervoltage signal of the power supply voltage.

The high-voltage MOSFET control module includes a zero-voltage sensing (ZVS) module, a high-voltage switching logic control module, and a high-voltage level-shift module.

The zero-voltage sensing module is enabled by the enable signal. The zero-voltage sensing module samples signals at the switch node of the gate drive circuit of the GaN power devices under the control of the second low-side control signal and generates a zero-voltage sensing signal. If the signal at the switch node of the gate drive circuit of the GaN power devices has a high voltage, the zero-voltage sensing signal is at a low level. If the signal at the switch node of the gate drive circuit of the GaN power devices nears zero, the zero-voltage sensing signal is at a high level.

The second low-side control signal and the gate drive signal of the lower power transistor are at the same logic level, and the second low-side control signal is obtained by delaying the first low-side control signal.

The high-voltage switching logic control module is enabled by the enable signal for generating a determination signal according to the zero-voltage sensing signal and the first low-side control signal.

The high-voltage level-shift module is configured to shift a power rail of the determination signal from power supply voltage to ground to output terminal signal of switching bootstrap charging circuit to switch node signal.

The high-voltage switching logic control module generates the gate drive signal of the high-voltage MOSFET according to the determination signal processed by the high-voltage level-shift module and the second undervoltage signal. The gate drive signal of the high-voltage MOSFET is at the low level only when the second undervoltage signal, the first low-side control signal, and the zero-voltage sensing signal are all at the high level; otherwise, the gate drive signal of the high-voltage MOSFET is at the high level.

The second undervoltage signal is an undervoltage signal between the output terminal of the switch bootstrap charging circuit suitable and the switch node.

Specifically, the zero-voltage sensing module includes the third inverter INV3, the first resistor R1, the second resistor R2, the third resistor R3, the fourth resistor R4, the fifth resistor R5, the sixth resistor R6, and the seventh resistor R7, the eighth resistor R8, the ninth resistor R9, the tenth resistor R10, the twenty-sixth NMOS transistor MN26, the twenty-seventh NMOS transistor MN27, the third NMOS transistor MN3, the fourth NMOS transistor MN4, the fifth NMOS transistor MN5, the sixth NMOS transistor MN6, the seventh NMOS transistor MN7, the eighth NMOS transistor MN8, the ninth NMOS transistor MN9, the tenth NMOS transistor MN10, the eleventh NMOS transistor MN11, the twelfth NMOS transistor MN12, the thirteenth NMOS transistor MN13, the fourteenth NMOS transistor MN14, the fifteenth NMOS transistor MN15, the sixteenth NMOS transistor MN16, the seventeenth NMOS transistor MN17, the eighteenth NMOS transistor MN18, the nineteenth NMOS transistor MN19, the twentieth NMOS transistor M1, the twenty-first NMOS transistor M2, the twenty-second NMOS transistor M3, the twenty-third NMOS transistor M4, the twenty-fourth NMOS transistor M5, the twenty-fifth NMOS transistor MH1, the eighteenth PMOS transistor MP18, the second PMOS transistor MP2, the third PMOS transistor MP3, the fourth PMOS transistor MP4, the fifth PMOS transistor MP5, the sixth PMOS transistor MP6, the seventh PMOS transistor MP7, the eighth PMOS transistor MP8, the ninth PMOS transistor MP9, the tenth PMOS transistor MP10, the eleventh PMOS transistor MP11, the twelfth PMOS transistor MP12, the thirteenth PMOS transistor MP13, the fourteenth PMOS transistor MP14, the fifteenth PMOS transistor MP15, the sixteenth PMOS transistor MP16, and the seventeenth PMOS transistor MP17, wherein, the twenty-fifth NMOS transistor is a high voltage transistor.

One end of the tenth resistor is connected to the switch node of the gate drive circuit of the GaN power devices, and the other end of the tenth resistor is connected to the drain of the twenty-fifth NMOS transistor.

The gate of the twentieth NMOS transistor is connected to gates of the twenty-fifth NMOS transistor and the twenty-first NMOS transistor and is connected to the second low-side control signal, the source of the twentieth NMOS transistor is connected to the source of the twenty-fifth NMOS transistor, and the drain of the twentieth NMOS transistor is connected to the source of the twenty-first NMOS transistor and the drain of the twenty-fourth NMOS transistor.

The drain of the twenty-first NMOS transistor is connected to the drain of the twenty-third NMOS transistor and outputs a sampling signal.

The gate of the twenty-second NMOS transistor is connected to gates of the twenty-third NMOS transistor and the twenty-fourth NMOS transistor and connected to the inverted signal of the second low-side control signal, the drain of the twenty-second NMOS transistor is connected to a first reference voltage, and the source of the twenty-second NMOS transistor is connected to the source of the twenty-third NMOS transistor.

The source of the twenty-fourth NMOS transistor is grounded.

The gate of the sixteenth PMOS transistor is connected to the sampling signal, the source of the sixteenth PMOS transistor is connected to the source of the seventeenth PMOS transistor and connected to the drain of the fifth PMOS transistor through the third resistor, and the drain of the sixteenth PMOS transistor is connected to the source of the eighth NMOS transistor and the drain of the ninth NMOS transistor.

The gate of the seventeenth PMOS transistor is connected to a second reference voltage, and the drain of the seventeenth PMOS transistor is connected to the source of the tenth NMOS transistor and the drain of the eleventh NMOS transistor.

The source of the fifth PMOS transistor is connected to the drain of the sixth PMOS transistor.

The gate of the ninth NMOS transistor is connected to the gate of the eleventh NMOS transistor.

The gate of the eighth NMOS transistor is connected to the a gate of the tenth NMOS transistor, the drain of the eighth NMOS transistor is connected to the gate of the twelfth NMOS transistor and connected to the gate and the drain of the seventh PMOS transistor by a fourth resistor.

One end of the fifth resistor is connected to the gate of the seventh PMOS transistor, and the other end of the fifth resistor is connected to the drain of the tenth NMOS transistor and the gate of the thirteenth NMOS transistor.

The gate of the twenty-sixth NMOS transistor is connected to the inverted signal of the first undervoltage signal, the drain of the twenty-sixth NMOS transistor is connected to the gate of the third NMOS transistor, the gate and the drain of the twenty-seventh NMOS transistor, and a bias signal, and the source of the twenty-sixth NMOS transistor is connected to sources of the twenty-seventh NMOS transistor, the third NMOS transistor, the fifth NMOS transistor, the seventh NMOS transistor, the ninth NMOS transistor, the eleventh NMOS transistor, the fifteenth NMOS transistor, the sixteenth NMOS transistor, and the seventeenth NMOS transistor, and is grounded.

The gate of the second PMOS transistor is connected to gates of the third PMOS transistor, the fifth PMOS transistor, and the tenth PMOS transistor and the drain of the third NMOS transistor, and the gate of the second PMOS transistor is connected to a drain of the second PMOS transistor and gates of the eighteenth PMOS transistor, the fourth PMOS transistor, the sixth PMOS transistor, and the ninth PMOS transistor through the first resistor, and the source of the second PMOS transistor is connected to the drain of the eighteenth PMOS transistor.

The rain of the fourth PMOS transistor is connected to the source of the third PMOS transistor, and the source of the fourth PMOS transistor is connected to sources of the eighteenth PMOS transistor, the sixth PMOS transistor, the seventh PMOS transistor, the eighth PMOS transistor, the ninth PMOS transistor, the eleventh PMOS transistor, and the fourteenth PMOS transistor, and is connected to the power supply voltage.

The gate of the fourth NMOS transistor is connected to gates of the sixth NMOS transistor and the fourteenth NMOS transistor and a drain of the third PMOS transistor, and is connected to the drain of the fourth NMOS transistor and gates of the fifth NMOS transistor, the seventh NMOS transistor, and the fifteenth NMOS transistor through the second resistor, and the source of the fourth NMOS transistor is connected to the drain of the fifth NMOS transistor.

The source of the fourteenth NMOS transistor is connected to the drain of the fifteenth NMOS transistor, and the drain of the fourteenth NMOS transistor is connected to sources of the twelfth NMOS transistor and the thirteenth NMOS transistor.

One end of the sixth resistor is connected to the gate and the drain of the eighth PMOS transistor and one end of the seventh resistor, and the other end of the sixth resistor is connected to the drain of the twelfth NMOS transistor and gates of the thirteenth PMOS transistor and the eighteenth NMOS transistor.

The gate of the twelfth PMOS transistor is connected to the other end of the seventh resistor, the drain of the thirteenth NMOS transistor, and the gate of the nineteenth NMOS transistor. The source of the twelfth PMOS transistor is connected to the source of the thirteenth PMOS transistor and the drain of the tenth PMOS transistor. The drain of the twelfth PMOS transistor is connected to the gate and the drain of the sixteenth NMOS transistor and is connected to the drain of the thirteenth PMOS transistor and the gate of the seventeenth NMOS transistor through the eighth resistor.

The source of the tenth PMOS transistor is connected to the drain of the ninth PMOS transistor.

The gate of the fourteenth PMOS transistor is connected to the drain of the eighteenth NMOS transistor and is connected to the gate and the drain of the eleventh PMOS transistor and the drain of the nineteenth NMOS transistor through the ninth resistor. The drain of the fourteenth PMOS transistor is connected to drains of the seventeenth NMOS transistor and the fifteenth PMOS transistor and the input terminal of the third inverter.

The drain of the sixth NMOS transistor is connected to sources of the eighteenth NMOS transistor and the nineteenth NMOS transistor, and the source of the sixth NMOS transistor is connected to the drain of the seventh NMOS transistor.

The gate of the fifteenth PMOS transistor is connected to the enable signal, and the source of the fifteenth PMOS transistor is connected to the power supply voltage.

The output terminal of the third inverter outputs the zero-voltage sensing signal.

The present invention has the following advantages.

The switch bootstrap charging circuit provided by the present invention uses a dual-MOSFET-switches structure to avoid a negative switch node voltage problem and charges the bootstrap capacitor $C_{boot}$ with high-voltage MOSFET replacing conventional on-chip bootstrap diode. The bootstrap capacitor $C_{boot}$ gets charged only when the lower power transistor is turned on, which prevents overvoltage on the bootstrap capacitor $C_{boot}$, thereby avoiding the overcharge caused by the negative switch node voltage, realizing on-chip integration, simple circuit structure, low cost and small area, and high reliability. By replacing the bootstrap diode with the high-voltage MOSFET, the problem of malfunction caused by voltage crosstalk at the switch node SW can be avoided, meanwhile, the problems of reverse recovery loss of the bootstrap diode and degradation of load capacity in high-frequency application are eliminated. The present invention is especially suitable for supplying power to the floating power supply rails of the gate drive of the high frequency high power density for GaN power devices.

DETAILED DESCRIPTION OF THE EMBODIMENTS

The technical solutions of the present invention are described in detail below with reference to the drawings and specific embodiments.

The present invention provides a switch bootstrap charging circuit suitable for a gate drive circuit of a GaN power device. For the problem of negative voltage at the switch node of the gate drive circuit of the GaN power devices, the dual-MOSFET-switches structure including the high-voltage MOSFET and the low-voltage MOSFET is used to control the switching on of the bootstrap charging path, so that the switch bootstrap charging circuit will not charge the bootstrap capacitor during the dead time, and the problem of overvoltage on the bootstrap capacitor can be avoided. Specifically, the low-voltage MOSFET is a PMOS transistor, the high-voltage MOSFET described in embodiment 1 is an NMOS transistor, and the high-voltage MOSFET described in embodiment 2 is a PMOS transistor. Moreover, according to the control modules relative to the high-voltage MOSFET and the low-voltage MOSFET in the two embodiments, corresponding control strategies are respectively provided, so that the high-voltage MOSFET and the low-voltage MOSFET can be turned on or off at the same time with the lower power transistor.

Embodiment 1

In the present embodiment, the dual-MOSFET-switches structure constituted by the high-voltage MOSFET, i.e. the first NMOS transistor MN1, and the low-voltage MOSFET, i.e. the first PMOS transistor MP1, is configured to control the switching on of the bootstrap charging path. The dual charge pump circuit constituted by the first capacitor C1 and the second capacitor C2 is used to control the switching on of the first NMOS transistor MN1. The first NMOS transistor MN1 is used to replace the bootstrap diode $D_{boot}$ in the conventional bootstrap charging circuit. The present invention can be applied for a high-speed gate drive of the GaN power devices. It should be noted that the system control method and the specific circuit design used in the present invention can also be applied in the drive circuits of Si power switch devices and other wide bandgap semiconductor switch devices (e.g. SiC power switch devices). Any occasion that needs to provide a bootstrap charging circuit for the bootstrap capacitor can use the switch bootstrap charging circuit provided by the present invention. The working principle and working process of the present invention will be described in detail below with an example that the switch bootstrap charging circuit of the present invention is applied to the gate drive circuit of the GaN power devices.

Figure 1:
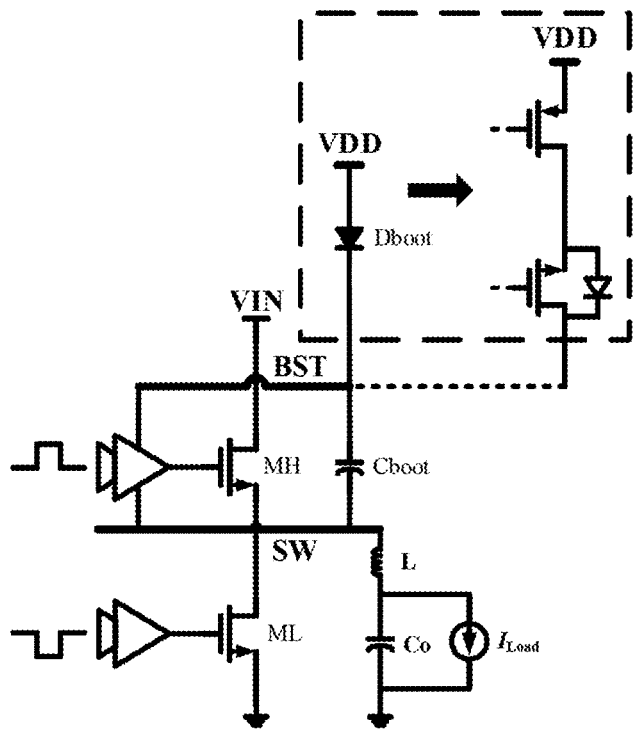
FIG. 1 is topology diagrams of a traditional bootstrap circuit and one of the proposed bootstrap circuit utilizing dual-MOSFET-switches in half-bridge gate drive circuit.
Figure 2:
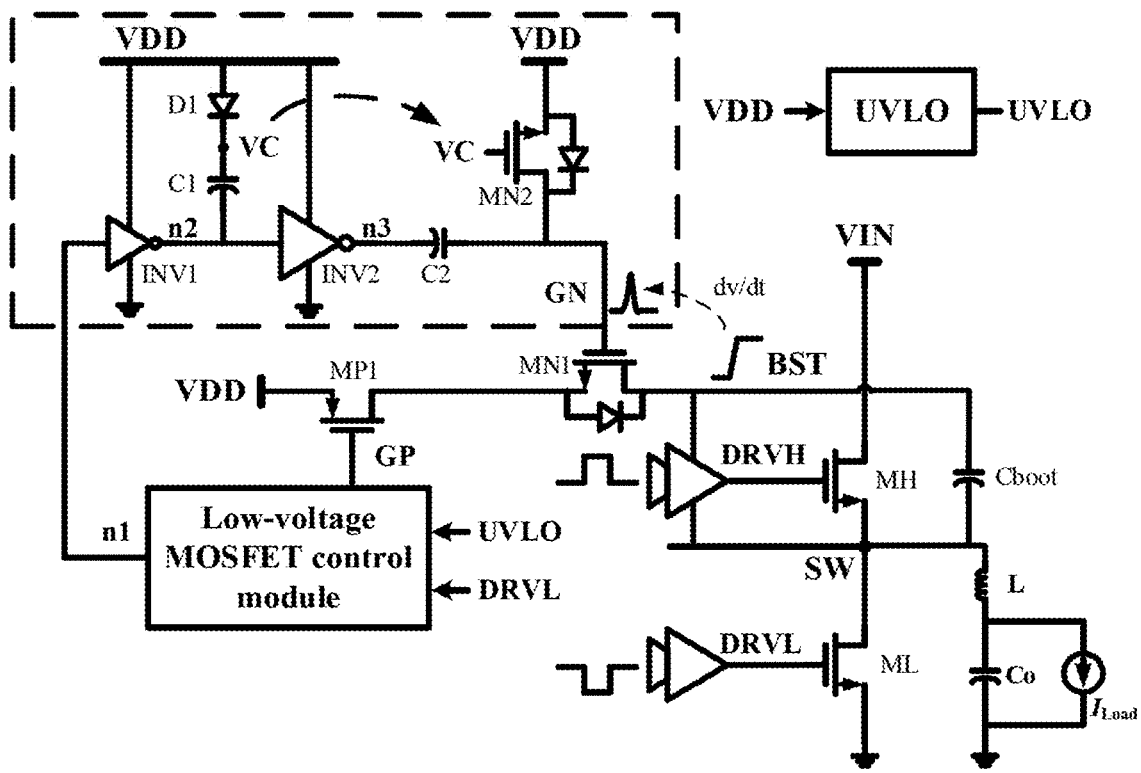
FIG. 2 is a structural schematic diagram of a switch bootstrap charging circuit suitable for a gate drive circuit of a GaN power device according to the present invention.

As shown in FIG. 2, the gate drive circuit of the GaN power devices includes a high-side GaN power device, i.e. an upper power transistor MH, and a low-side GaN power device, i.e. a lower power transistor ML. The gate drive signal of the high-side GaN power device MH is the high-side gate drive signal DRVH, the gate drive signal of the low-side GaN power device ML is the low-side gate drive signal DRVL. One terminal of the bootstrap capacitor $C_{boot}$ is connected to the output terminal BST of the switch bootstrap charging circuit provided by the present invention, and the other terminal of the bootstrap capacitor $C_{boot}$ is connected to the switch node SW of the high-side GaN power device MH and the low-side GaN power device ML.

As shown in FIG. 2, the switch bootstrap charging circuit provided in the present embodiment includes the first PMOS transistor MP1, the first NMOS transistor MN1, the second NMOS transistor MN2, the first inverter INV1, the second inverter INV2, a capacitor C1, the second capacitor C2, the first diode D1, and a control logic module. The control logic module is configured to generate the first control signal n1 and the gate drive signal GP of the low-voltage MOSFET according to the first undervoltage signal UVLO and the gate drive signal DRVL of the lower power transistor. The first undervoltage signal UVLO is an undervoltage protection signal generated when the power supply voltage VDD starts to work. When the first undervoltage signal UVLO is at a low level, the first control signal n1 and the gate drive signal GP of the low-voltage MOSFET are at a low level. When the first undervoltage signal UVLO is at a high level, the first control signal n1 and the gate drive signal DRVL of the lower power transistor are at the same logic level, and the gate drive signal GP of the low-voltage MOSFET and the gate drive signal DRVL of the lower power transistor are at reverse logic levels. The gate of the first PMOS transistor MP1 is connected to the gate drive signal GP of the low-voltage MOSFET, the source of the first PMOS transistor MP1 is connected to the power supply voltage VDD, and the drain of the first PMOS transistor MP1 is connected to the source of the first NMOS transistor MN1. The input terminal of the first inverter INV1 is connected to the first control signal n1, and the output terminal of the first inverter INV1 is connected to the input terminal of the second inverter INV2 and is connected to the cathode of the first diode D1 and the gate of the second NMOS transistor MN2 through the first capacitor C1. The anode of the first diode D1 and the source of the second NMOS transistor MN2 are connected to the power supply voltage VDD. The gate of the first NMOS transistor MN11 is connected to the drain of the second NMOS transistor MN2 and is connected to the output terminal of the second inverter INV2 through the second capacitor C2, and the drain of the first NMOS transistor MN1 serves as an output terminal of the switch bootstrap charging circuit.

Specifically, for the purpose of withstanding the high voltage of the output terminal BST of the bootstrap switch charging circuit, the first NMOS transistor MN1 is a high-voltage device. In the present embodiment, a high voltage NLDMOS transistor is selected as the first NMOS transistor MN1, a low voltage NMOS transistor may be selected as the second NMOS transistor MN2 since there is no requirement for the voltage withstanding performance. The first PMOS transistor MP1 may be a low voltage PMOS, because the first NMOS transistor MN1 that can withstand high voltage is provided on the charging path of the first PMOS transistor MP1, and the area of the high-voltage MOS device and the parasitic parameters are relatively larger (which may affect the high frequency performance of the circuit).

In the present embodiment, the first PMOS transistor MP1 is a low-voltage PMOS switch, and the first NMOS transistor MN1 is a high-voltage NLDMOS switch. The low-voltage PMOS switch and the high-voltage NLDMOS switch constitute the double switch structure to control the switching on of the bootstrap charging circuit. The source of the first PMOS transistor MP1 is connected to the low-voltage power supply, i.e. the power supply voltage VDD, which facilitates the logic signal control. While, the first NMOS transistor MN1 replaces the bootstrap diode $D_{boot}$ in the conventional bootstrap charging circuit and serves as a bootstrap MOSFET, which can ensure the following conditions. 1. When the voltage signal of the output terminal BST of the switch bootstrap charging circuit is raised, the first NMOS transistor MN1 can withstand high voltage, and the body diode is cut off. 2. The body diode of the first NMOS transistor MN1 is used for charging the bootstrap capacitor when power-on. 3. When the first PMOS transistor MP1 and the first NMOS transistor MN1 are turned off, the two body diodes have opposite directions, and the charging path is completely blocked. Meanwhile, since the bootstrap diode D charges the bootstrap capacitor $C_{boot}$ and the charging current can reach several hundred milliamperes, in order to ensure the load capability of the diode, the bootstrap diode $D_{boot}$ should be designed in large size. The ordinary diodes are difficult to meet the requirements of high voltage and high current and have severe reverse recovery effect, so an external Schottky diode or a fast recovery diode is usually required. Therefore, in the present invention, the bootstrap diode $D_{boot}$ in the conventional bootstrap charging circuit is replaced by the first NMOS transistor MN1. Moreover, since there is no high voltage on the first diode D1 in the present invention and no large current is required, an ordinary on-chip diode can satisfy the requirement, so that the present invention can realize the full integration of the circuit. The first NMOS transistor MN1 that is turned on can reduce the loss of the charging voltage caused by the turn-on voltage of the bootstrap diode $D_{boot}$. Further, in the present invention, without being limited by the reverse recovery of the bootstrap diode $D_{boot}$, the reverse recovery current and reverse recovery loss are eliminated, so the chip is allowed to operate at higher frequencies.

The formula of voltage on the bootstrap capacitor $C_{boot}$ is as follows:

$$V_{boot} = V_0 + (V_1 - V_0)(1 - e^{-\frac{t}{RC}})$$

where, $V_{boot}$ is the voltage on the bootstrap capacitor $C_{boot}$ at time t, $V_0$ is the initial voltage on the bootstrap capacitor $C_{boot}$. $V_1$ is the voltage that the bootstrap capacitor $C_{boot}$ can get, e is the natural constant, R is the equivalent charging resistance of the charging path. C is the capacitance of the bootstrap capacitor $C_{boot}$, and t is the charging time. During power-on, $V_0$ is zero V, $V_1$ is the stable value after the power supply voltage VDD is powered on, and the charging time for the $V_{boot}$ to reach $0.9 V_1$ is about t=2.3RC, i.e., it takes the time of 2.3RC to charge the bootstrap capacitor $C_{boot}$ from 0 V to 90% of the power supply voltage VDD after the power-on of the system.

The truth table of the main logic signal and the voltages of some key nodes in the present invention are shown in the following table. The first undervoltage signal UVLO is an undervoltage protection signal generated when the power supply voltage VDD starts to work. The first undervoltage signal UVLO is at a low level before the power supply voltage VDD reaches the undervoltage limit after power on, and is shifted to high level after exceeding the undervoltage limit. The undervoltage limit is generally slightly lower than the stable value after the power on of the power supply voltage VDD. When the first undervoltage signal UVLO in the table is "0", it indicates that the system is in the power-on process. When the first undervoltage signal UVLO is "1", it indicates that the system is in the normal working state. The charge sharing effect and the overdrive voltage $V_{ov}$ of the MOS transistor are ignored here.

| Logic input | | Logic output | | Charge pump 1 (C1) | | Charge pump 2 (C2) | |
|---|---|---|---|---|---|---|---|
| UVLO | DRVL | GP | n1 | n2 | VC | n3 | GN |
| 0 | * | 0 | 0 | VDD | VDD-0.7 | GND | VDD-0.7 |
| 1 | 1 | 0 | 1 | GND | VDD-0.7 | VDD | 2VDD |
| 1 | 0 | 1 | 0 | VDD | 2VDD-0.7 | GND | VDD |

Figure 4:
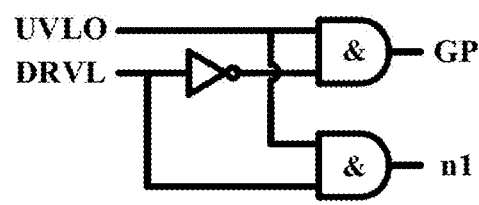
FIG. 4 is a schematic circuit diagram of the logic control module in embodiment 1.
Figure 5:
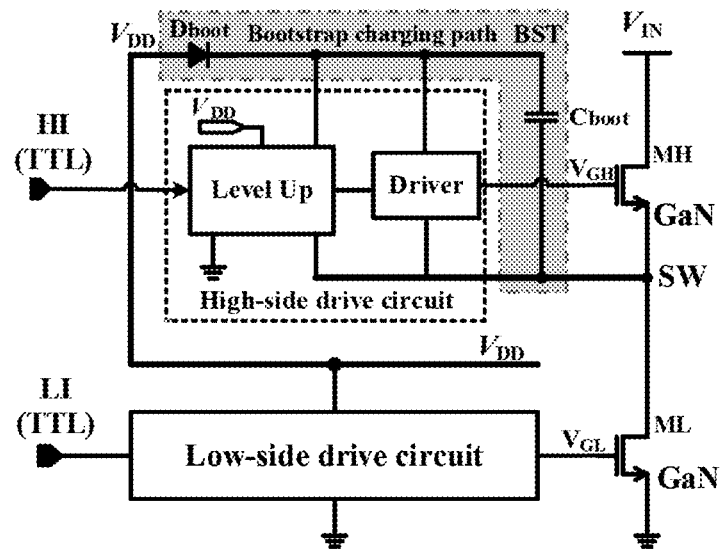
FIG. 5 is topology diagrams of a traditional bootstrap circuit and one of the proposed bootstrap circuit utilizing a bootstrap diode in half-bridge gate drive circuit.

According to the above table, the control logic module generates the first control signal n1 and the gate drive signal GP of the low-voltage MOSFET according to the first undervoltage signal UVLO and the gate drive signal DRVL of the lower power transistor. The schematic circuit of the control logic module is shown in FIG. 4. The control logic module is constituted by two AND gates and an inverter. The first undervoltage signal UVLO and the gate drive signal DRVL of the lower power transistor generate the first control signal n1 after passing through an AND gate. The inverted signal of the first undervoltage signal UVLO and the gate drive signal DRVL of the lower power transistor generate the gate drive signal GP of the low-voltage MOSFET after passing through the other AND gate. When the first undervoltage signal UVLO is at a low level, the first control signal n1 and the gate drive signal GP of the low-voltage MOSFET are at a low level. When the first undervoltage signal UVLO is at a high level, the first control signal n1 and the gate drive signal DRVL of the lower power transistor are at the same logic level, and the gate drive signal GP of the low-voltage MOSFET and the gate drive signal DRVL of the lower power transistor are at reverse logic levels. The first control signal n1 passes the first inverter INV1 to generate the signal n2. The VC signal is the voltage signal of the signal n2 after passing through the first capacitor C1 and is connected to the gate of the second NMOS transistor MN2. The signal n3 is a signal after the signal n2 passes through the second inverter INV2. The power supply terminals of the first inverter INV1 and the second inverter INV2 are connected to the power supply voltage VDD, and the ground terminals are grounded with the signal GND. The signal GN is a voltage signal after the signal n3 passes through the second capacitor C2 and is connected to the gate of the first NMOS transistor MN1.

The working process of the present embodiment is as follows.

Figure 3:
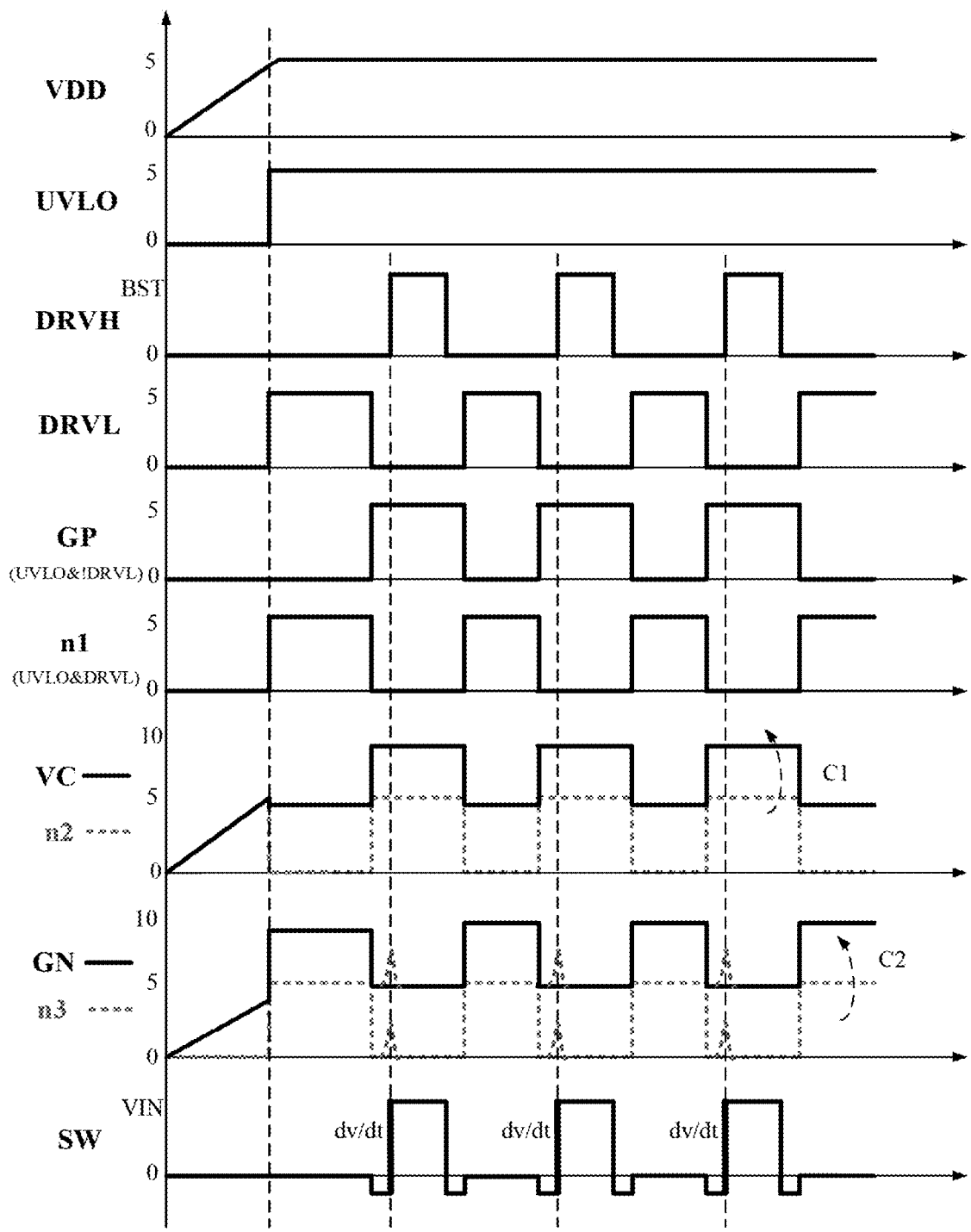
FIG. 3 is a logic waveform diagram of correlated signals in embodiment 1 of a switch bootstrap charging circuit suitable for a gate drive circuit of a GaN power device according to the present invention.

The first undervoltage signal UVLO is at a low level after the system is powered on and before the power supply voltage VDD reaches the undervoltage limit. At this time, the first undervoltage signal UVLO sets the first control signal n1 and the gate drive signal GP of the low-voltage MOSFET to a low potential, as shown in the above table and waveforms of FIG. 3. Therefore, the first PMOS transistor MP1 of the low-voltage PMOS transistor is turned on during the power-on stage, and the first NMOS transistor MN1 of the high-voltage NLDMOS is turned off. The power supply voltage VDD charges the bootstrap capacitor $C_{boot}$ through the first PMOS transistor MP1 and the body diode of the first NMOS transistor MN1, thereby increasing the equivalent charging resistance of the charging path, which can limit the bootstrap charging current during power-on, and achieve the purpose of slowly charging the bootstrap capacitor $C_{boot}$ during the power-on of the system. The signal n2 outputted by the first inverter INV1 is at a high level, and the signal n3 outputted by the second inverter INV2 is at a low level.

Thus, the first diode D1 is not turned on, there is no charge on the first capacitor C1, and the second NMOS transistor MN2 is turned off. Therefore, during the power-on of the power supply voltage VDD, the dual charge pump circuit behaves as that the power supply voltage VDD charges the second capacitor C2 through the body diode of the second NMOS transistor MN2. The voltage on the second capacitor C2 is the power supply voltage VDD minus a forward voltage drop of a PN junction, which is about VDD-0.7V.

After the first undervoltage signal UVLO is shifted to high level, the logic of the first NMOS transistor MN1 and the first PMOS transistor MP1 during normal operation can be simply controlled by the gate drive signal DRVL of the lower power transistor. The first control signal n1 and the gate drive signal DRVL of the lower power transistor are at the same logic level, and the gate drive signal GP of the low-voltage MOSFET and the gate drive signal DRVL of the lower power transistor are at reverse logic levels. After the power on of the power supply voltage VDD is completed, the first undervoltage signal UVLO is shifted to high level. The lower power transistor ML is firstly turned on. The gate drive signal DRVL of the lower power transistor is at a high level, and the gate drive signal GP of the low-voltage MOSFET connected to the gate of the first PMOS transistor MP1 is at a low level, so that the first PMOS transistor MP1 is turned on. The first control signal n1 is at a high level, and the signal n2 outputted after the first control signal n1 passing through the first inverter INV1 is at a low level. The power supply voltage VDD charges the first capacitor C1 through the first diode D1, and the first capacitor C1 gets charged until the voltage reaches VDD-0.7V. The signal n3 outputted after the signal n2 passing through the second inverter INV2 is at a high level. Since the second capacitor C2 has been charged in the previous stage, at the moment when the level of the signal is shifted, the gate signal GN of the first NMOS transistor MN1 will be pumped to a voltage of about 2VDD-0.7V, so the first NMOS transistor MN1 is turned on and the bootstrap charging path conducts. However, due to the slow charging process during the power-on, the charges have already existed on the bootstrap capacitor $C_{boot}$ at this time, so the extreme situation where the suddenly turned-on charging circuit directly charges the bootstrap capacitor $C_{boot}$ to make the voltage raise from 0V to the stable value of the power supply voltage VDD can be avoided.

As the next control signal arrives, the gate drive signal DRVL of the lower power transistor is shifted to low level. The duration when the gate drive signal DRVL of the lower power transistor is at a low level, includes the dead time and the time for the upper power transistor to be turned on. The gate drive signal DRVH of the upper power transistor and the gate drive signal DRVL of the lower power transistor are both at a low level during the dead time. The gate drive signal DRVH of the upper power transistor is at a high level during the time for the upper power transistor to be turned on, and the gate drive signal DRVL of the lower power transistor is at a low level. Since the gate drive signal DRVL of the lower power transistor is at a low level, the gate drive signal GP of the low-voltage MOSFET connected to the gate of the first PMOS transistor MP1 is at a high level. The first PMOS transistor MP1 is turned off to ensure that the bootstrap charging circuit will not charge the bootstrap capacitor $C_{boot}$ when the switch node SW has negative voltage. When the first control signal n1 connected to the input terminal of the first inverter INV1 is at a low level, the signal n2 outputted by the first inverter INV1 is at a high level, and the VC voltage at the gate of the second NMOS transistor MN2 is pumped to 2VDD-0.7V. When the signal n3 outputted by the second inverter INV2 is at a low level, and the VC voltage at the gate of the second NMOS transistor MN2 is higher than the source voltage of the second NMOS transistor MN2 (i.e. the power supply voltage VDD), the power supply voltage VDD charges the second capacitor C2 through the second NMOS transistor MN2 which is turned on. The previous form of charging by the body diode of the second NMOS transistor MN2 is changed. Since during the switching on of the upper power transistor, the voltage change rate dv/dt at the output terminal BST of the switch bootstrap charging circuit interferes the signal GN of the gate of the first NMOS transistor MN1 through the parasitic capacitance of the first NMOS transistor MN1, thereby causing an increase of the voltage of the GN signal. If the second NMOS transistor MN2 is turned off at this time, and the second capacitor C2 keeps getting charged by the body diode of the second NMOS transistor MN2, the voltage increase of the signal GN will cause the cut off of the body diode of the second NMOS transistor MN2. As the signal GN has no low-resistance path to be connected to other voltages, the GN signal is in a high-Z state and is seriously affected by crosstalk. The crosstalk will cause the first NMOS transistor MN1 to be turned on by mistake, so the first NMOS transistor MN1 does not block the high voltage at the output terminal BST of the switch bootstrap charging circuit at this time, and the high voltage will cause breakdown of the first PMOS transistor MP1. In the present embodiment, the dual charge pump circuit constituted by the first capacitor C1 and the second capacitor C2 could raise the voltage of the signal GN to the power supply voltage VDD through the turned-on second NMOS transistor MN2 to provide a low resistance path for the signal GN. Thus, the signal GN is in a low-impedance state, which can effectively avoid the effect of the high voltage change rate dv/dt of the voltage at the output terminal BST of the switch bootstrap charging circuit on the voltage of the signal GN when the upper power transistor MH is turned on, thereby enhancing the reliability of the circuit.

After that, await for the next switching cycle to repeat the above work cycle.

In summary, the present embodiment provides a specific circuit for implementing the switch bootstrap charging circuit of the present invention. During the power-on of the power supply voltage VDD, the power supply voltage VDD charges the bootstrap capacitor $C_{boot}$ through the body diode of the first NMOS transistor MN1, which increases the equivalent charging resistance of the charging path, so the bootstrap charging current during the power-on can be limited, and the purpose of slowly charging the bootstrap capacitor during the power-on process of the system can be achieved. When the switch node SW is at a negative voltage, the first PMOS transistor MP1 and the first NMOS transistor MN1 are both turned off, and the path for the power supply voltage VDD to the bootstrap capacitor $C_{boot}$ is blocked off. Therefore, in the present invention, the bootstrap capacitor $C_{boot}$ will not get charged under the negative voltage. The first PMOS transistor MP1 and the first NMOS transistor MN1 are both turned on in the normal charging state, so as to reduce the RC charging constant of the bootstrap charging path. The present invention ensures that the bootstrap capacitor $C_{boot}$ is sufficiently charged in the turn-on duration of the lower power transistor.

In the present embodiment, the charging path is controlled by the dual-MOSFET-switches structure constituted by the first NMOS transistor MN1 and the first PMOS transistor MP1. The bootstrap capacitor $C_{boot}$ is gently charged during the power-on process of the power supply voltage VDD. The first NMOS transistor MN1 is turned off when the bootstrap capacitor $C_{boot}$ supplies power to the high-side drive and the voltage of the switch node SW rises, so the bootstrap charging path is blocked off. Since the drain terminal of the first NMOS transistor MN1 of the high-voltage NLDMOS can withstand high voltage, and the bootstrap charging circuit is turned on only when the lower power transistor is turned on, the load capability of the bootstrap charging circuit can be ensured without the charging voltage loss caused by the turn-on voltage of the bootstrap diode. In addition, the bootstrap capacitor $C_{boot}$ is not charged during the dead time, so the problem of excessive voltage on the bootstrap capacitor $C_{boot}$ can be avoided. The dual charge pump circuit constituted by the first capacitor C1 and the second capacitor C2 supplies a gate voltage to the first NMOS transistor MN1, so as to control the switching on of the first NMOS transistor MN1. The first NMOS transistor MN1 is turned on only when the bootstrap capacitor $C_{boot}$ needs to get charged, and the influence of the crosstalk of the high voltage change rate dv/dt at the output terminal BST of the switch bootstrap charging circuit on the bootstrap charging circuit during the switching can be avoided. The first NMOS transistor MN1 replaces the bootstrap diode $D_{boot}$ in the conventional bootstrap charging circuit, so the on-chip integration of the circuit can be realized. Thus, there is no reverse recovery limit of the bootstrap diode $D_{boot}$, the reverse recovery current and reverse recovery loss are eliminated, and it is more suitable for high frequency applications. The implementation circuit of the present embodiment is simple, saves the cost and area of the chip, improves the reliability of the chip, and can be applied to any case where the bootstrap charging for the bootstrap capacitor is required, especially for the high speed gate drive of the GaN devices.

Embodiment 2

Figure 6:
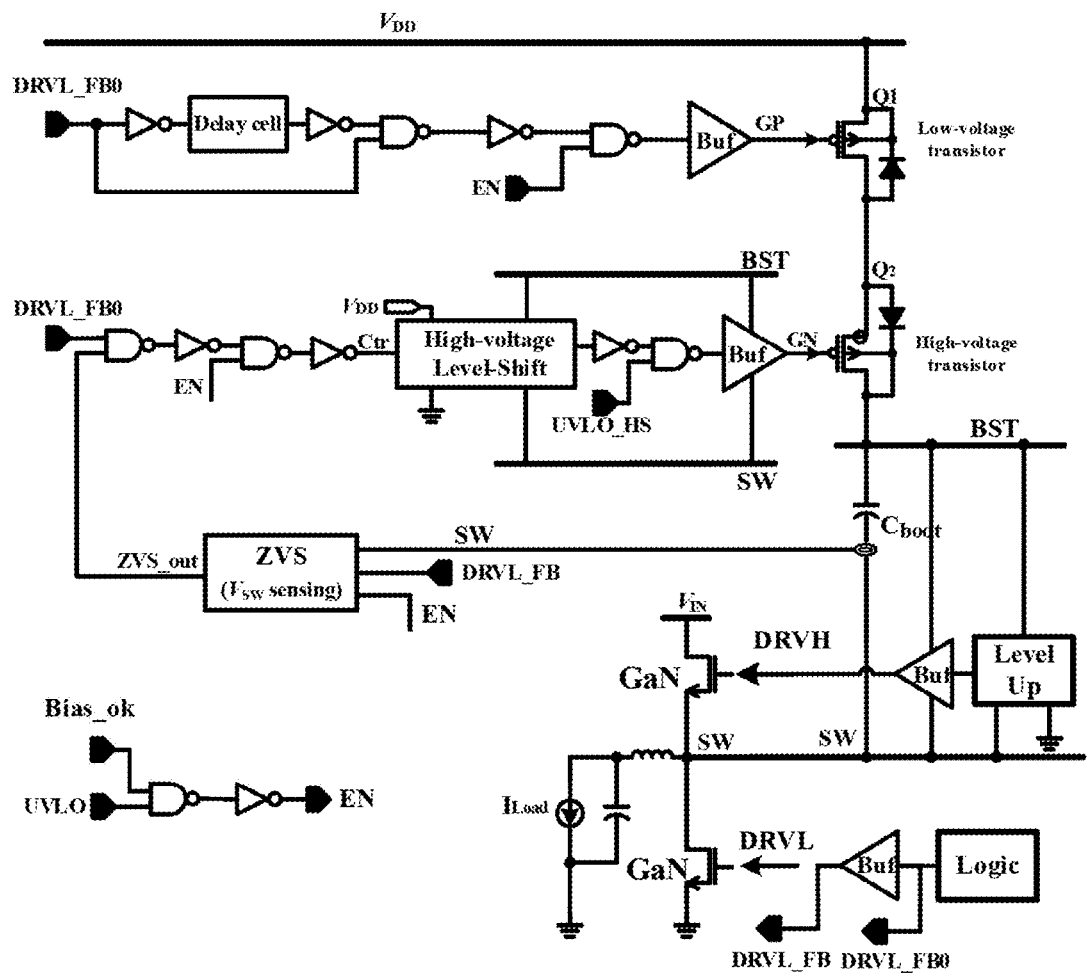
FIG. 6 is a topological diagram of a switch bootstrap charging circuit suitable for a gate drive circuit of a GaN power device according to embodiment 2 of the present invention.

FIG. 6 shows a specific circuit diagram of the present embodiment. The low-voltage MOSFET, represented by Q1, is a PMOS transistor for disconnecting the path for the power supply voltage VDD to the bootstrap capacitor $C_{boot}$ when a negative switch node voltage occurs. The high-voltage MOSFET, represented by Q2, is a high-voltage PMOS transistor, and the high-voltage MOSFET Q2 may be a P-type high-voltage LDMOS transistor. When the PLDMOS is used as the high-voltage switch, since the body diode needs to withstand the voltage in a reverse direction after the LDMOS channel is pinched off, the source of the PLDMOS can only be connected to the floating power supply rail BST. Therefore, the gate signal needs to reference to the switch node SW. Thus, the range of the PLDMOS gate signal is between the BST and the SW, and the case where misfunction occurs due to the crosstalk caused by the dv/dt of the voltage $V_{SW}$ at the power switch node SW will not occur. Moreover, since the bootstrap diode is replaced with a high-voltage switch that is turned on only when the low-side power transistor is turned on, such a bootstrap charging mode does not have the problem that the bootstrap capacitor $C_{boot}$ gets overcharged due to the negative voltage of the power switch node SW in the dead time. The diode reverse recovery loss and the degradation of the high-frequency load performance can also be eliminated, so the present invention is suitable for the power supply of the floating power rail of the high-frequency gate drive of the GaN devices.

The switch bootstrap charging circuit further includes a bootstrap capacitor $C_{boot}$. The high-voltage MOSFET Q2 is connected to the upper electrode plate of the bootstrap capacitor $C_{boot}$ and serves as a floating power rail BST. The lower electrode plate of the bootstrap capacitor $C_{boot}$ is connected to the switch node SW of the gate drive circuit. The enable signal EN and the first undervoltage signal UVLO are at the same logic level. The first undervoltage signal UVLO is an undervoltage signal of the power supply voltage VDD. When the power supply voltage VDD is below undervoltage limit, the first undervoltage signal UVLO is at low level, and the first undervoltage signal UVLO is shifted to high level after the power on of the power supply voltage VDD is completed. As shown in FIG. 6, the first undervoltage signal UVLO and the reference establishment enable signal Bias_ok pass through an AND gate to generate an enable signal EN, so that the enable signal EN is at a low level to turn off the bootstrap charging circuit when the power supply voltage VDD is undervoltage. After the power on of the power supply voltage VDD is completed, the enable signal EN is at a high level to turn on the bootstrap charging circuit. The reference establishment enable signal Bias_ok is an enable signal for establishing various reference signals for the system.

The low-voltage switching logic control module is enabled by the enable signal EN. The low-voltage switching logic control module operates when the enable signal EN is at a high level and generates a gate drive signal GP of the low-voltage MOSFET under the control of the first low-side control signal DRVL_FB0. The gate drive signal GP of the low-voltage MOSFET and the first low-side control signal DRVL_FB0 are at reverse logic levels. FIG. 6 shows a schematic circuit of the low-voltage switching logic control module.

The zero-voltage sensing module is enabled by the enable signal EN. The zero-voltage sensing module operates when the enable signal EN is at a high level and samples the voltage signal of the switch node SW of the gate drive circuit under the control of the second low-side control signal DRVL_FB to generate a zero-voltage sensing signal ZVS_out. When the lower power transistor is turned off, the first low-side control signal DRVL_FB0 and the second low-side control signal DRVL_FB are at a low level, the signal of the switch node SW of the gate drive circuit has a high voltage, and the zero-voltage sensing signal ZVS_out is at a low level. When the lower power transistor is turned on, the first low-side control signal DRVL_FB0 and the second low-side control signal DRVL_FB are at a high level, the signal of the switch node SW of the gate drive circuit approximates 0 (actual value is related to the load current $I_{Load}$ and the lower transistor on-resistance $R_{ds\_on}$, which equals to $-I_{Load}*R_{ds\_on}$), and the zero-voltage sensing signal ZVS_out is at a high level. The first low-side control signal DRVL_FB0 and the second low-side control signal DRVL_FB are at the same logic level as the gate drive signal DRVL of the lower power transistor. The second low-side control signal DRVL_FB is obtained by delaying the first low-side control signal DRVL_FB0.

Figure 7:
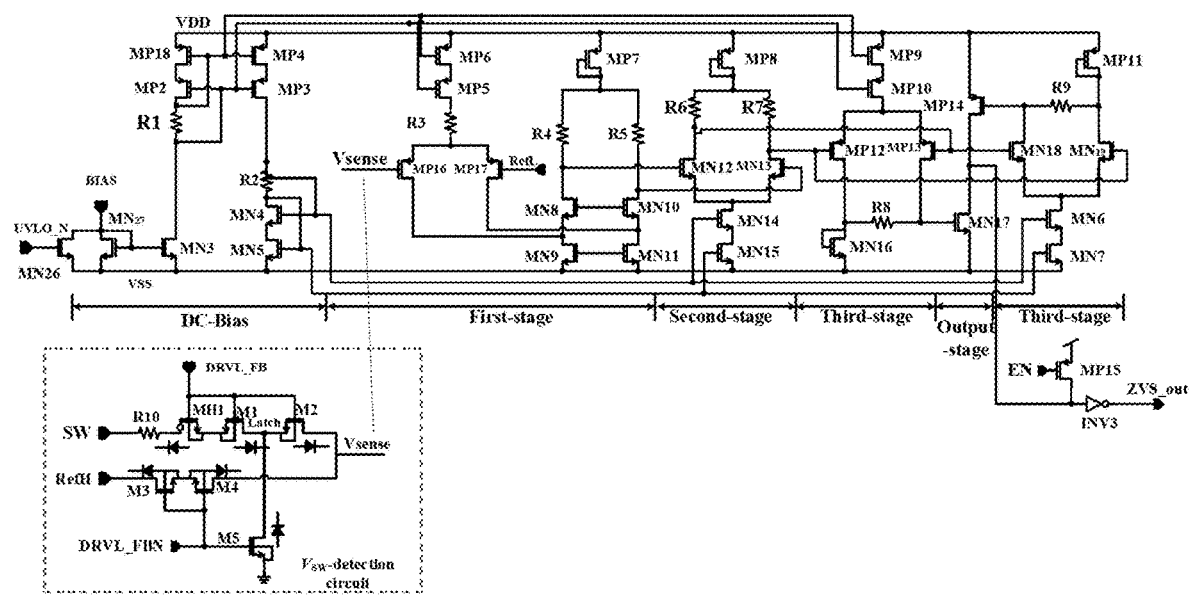
FIG. 7 is a schematic circuit diagram of a zero-voltage sensing module in embodiment 2.
Figure 8:
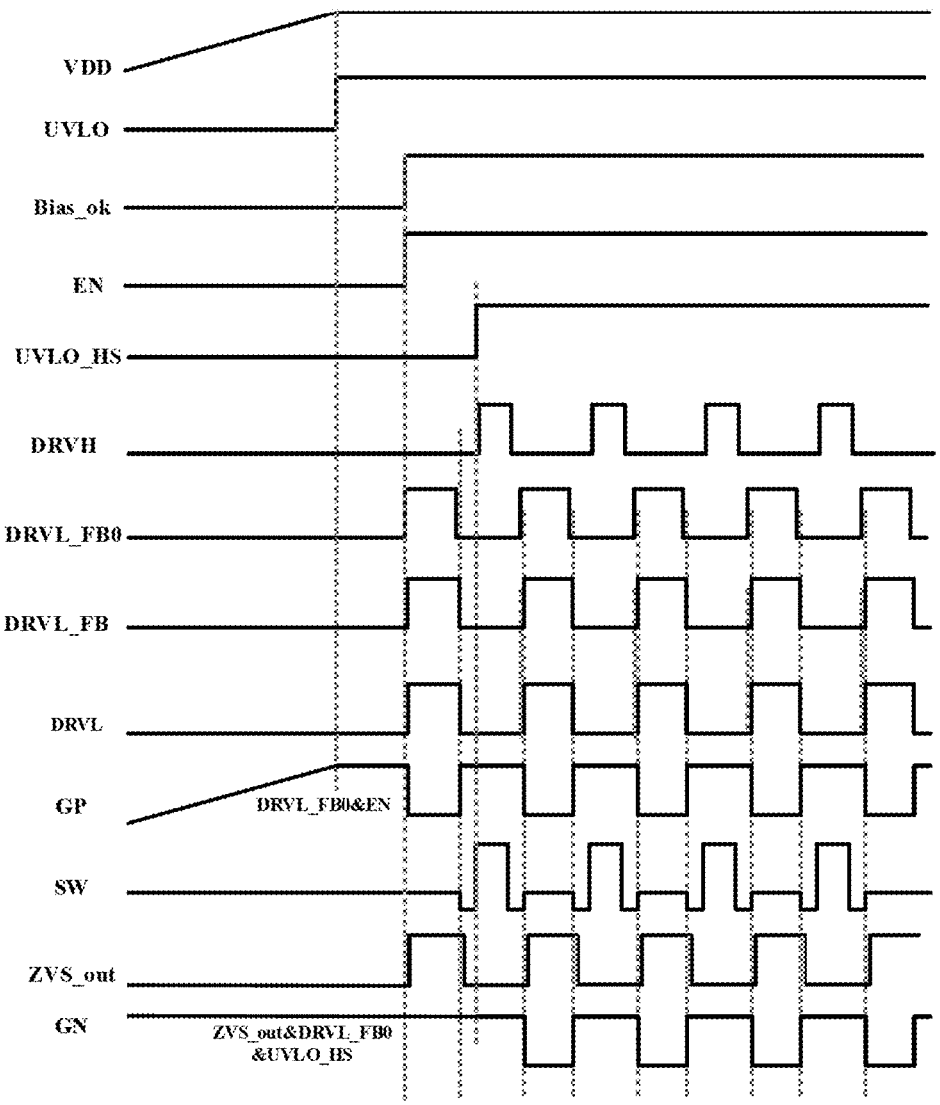
FIG. 8 is an operation control waveform diagram of a switch bootstrap charging circuit suitable for a gate drive circuit of a GaN power device according to embodiment 2 of the present invention.

A schematic circuit of the zero-voltage sensing module is shown in FIG. 7. The zero-voltage sensing module is composed of a SW detection circuit and a high-speed comparator. The high-speed comparator is a multi-stage comparator, the first stage and the second stage are low gain stages, and the third stage has a high gain stage structure. The third stage enables a single-terminal to double-terminal transformation to form a push-pull structure at the output stage, thereby improving the response speed.

The maximum output voltage of the comparator is:

$$V_{OH}=VDD \quad (1)$$

the minimum output voltage of the comparator is:

$$V_{OL}=VSS \quad (2)$$

the small signal gain of the comparator is:

$$A_v(0)=g_{m,MP16}g_{m,MN13}\cdot[R_5\|(r_{o,MN10}+r_{o,MN11})]\cdot[R_7\|r_{o,MN13}]\cdot[(g_{m,MP13}R_8+g_{m,MN19}R_9)] \quad (3)$$

where, $g_m$ represents the transconductance of the MOS transistor and $r_o$ represents the output resistance of the MOS transistor. The minimum input voltage to the comparator is expressed as below:

$$V_{in,min} = \frac{V_{OH} - V_{OL}}{A_{v(0)}} \quad (4)$$

It can be known from the expressions (3) and (4) that a high low frequency gain of the high-speed comparator can be obtained by rationally designing the values of the fifth resistor R5, the seventh resistor R7, the eighth resistor R8, and the ninth resistor R9, and the minimum input voltage to the comparator is higher as well. The transmission delay of the comparator can be approximately expressed as below:

$$t_p = \frac{V_{OH} - V_{OL}}{2 \cdot SR} \quad (5)$$

SR refers to the slew rate of the comparator. The third stage of the comparator in the present embodiment uses a structure for a single-terminal to double-terminal transformation to form a push-pull structure at the output stage, which greatly reduces the transmission delay of the whole comparator.

The twenty-sixth NMOS transistor MN26 and the fifteenth PMOS transistor MP15 are power-on enabling transistors. The zero-voltage sensing module does not work until the chip is powered on to remove the undervoltage protection. When the chip operates normally, the twenty-sixth NMOS transistor MN26 and the fifteenth PMOS transistor MP15 are turned off. The seventh PMOS transistor MP7, the eighth PMOS transistor MP8, the sixteenth NMOS transistor MN16, and the eleventh PMOS transistor MP1 are used to set the common mode input voltage of the circuits of the different stages. The SW detection circuit is composed of a high-voltage transistor i.e. the twenty-fifth NMOS transistor MH1 and low-voltage transistors i.e. the twentieth NMOS transistor M1, the twenty-first NMOS transistor M2, the twenty-second NMOS transistor M3, and the twenty-third NMOS transistor M4, and the twenty-fourth NMOS transistor M5. The twenty-fifth NMOS transistor may be an LDMOS transistor, and the drain of the twenty-fifth NMOS transistor is connected to the voltage $V_{SW}$ at the power switch node SW to prevent high voltage. The twentieth NMOS transistor M1 and the twenty-fourth NMOS transistor M5 from a negative voltage absorbing circuit, which prevent the internal circuit from being affected by the negative voltage $V_{SW}$ at the power switch node SW during the dead time. The twenty-first NMOS transistor M2, the twenty-second NMOS transistor M3, and the twenty-third NMOS transistor M4 are used to prevent the signal latch at the source of the twenty-first NMOS transistor M2, the sampling signal Vsense and the first reference voltage RefH from interacting with each other.

The first low-side control signal DRVL_FB0 and the second low-side control signal DRVL_FB are at the same logic level as the gate drive signal DRVL of the lower power transistor, and the second low-side control signal DRVL_FB is obtained by delaying the first low-side control signal DRVL_FB0. When the voltage at the switch node SW has risen from low voltage to high voltage, the zero-voltage sensing module still needs a certain response delay to output logic information showing that the voltages at the switch node SW and the floating power rail BST have risen. This delay will make the high-voltage MOSFET Q2 fail to be turned off immediately when the voltages at the switch node SW and the floating power rail BST have already risen. Thus, the high voltage cannot be stopped to apply on the low-voltage MOSFET Q1 in time, so the low-voltage MOSFET Q1 will be broken down and leak electricity to the power supply voltage VDD. Therefore, the zero-voltage sensing module is controlled by the second low-side control signal DRVL_FB, and the high-voltage MOSFET Q2 is directly turned off by using the first low-side control signal DRVL_FB0 whose control timing is earlier than that of the second low-side control signal DRVL_FB.

The high-voltage switching logic control module is enabled by the enable signal EN. The high-voltage switching logic control module operates when the enable signal EN is at a high level, and generates a determination signal Ctr according to the zero-voltage sensing signal ZVS_out and the first low-side control signal DRVL_FB0. Since the power rail of the determination signal Ctr is from the power supply voltage VDD to the ground, the high voltage level shifting module is required to shift the determination signal Ctr from the direction of the power supply voltage VDD to the low-side power rail of the ground to the direction of the signal at the output terminal (i.e. the floating power rail BST) of the switch bootstrap charging circuit to the high-side floating power rail of the signal at the switch node SW. The signal after being transferred to the high-side floating power rail is combined with the second under-voltage signal UVLO_HS on the high side to generate the gate drive signal GN of the high-voltage MOSFET. Since the second under-voltage signal UVLO_HS is an undervoltage signal for determining the voltage difference between BST and SW, the power rail is the high-side power rail from the floating power supply rail BST to the switch node SW as well. Only when the second undervoltage signal UVLO_HS, the first low-side control signal DRVL_FB0, and the zero-voltage sensing signal ZVS_out are all at a high level, the gate drive signal GN of the high-voltage MOSFET is at a low level to turn on the high-voltage MOSFET Q2. Otherwise, the gate drive signal GN of the high-voltage MOSFET is at a high level to turn off the high-voltage MOSFET Q2. A schematic circuit of the high-voltage switching logic control module is shown in FIG. 6. The high-voltage level-shift module in the present embodiment is further configured to reverse the logic level of the determination signal Ctr before outputting.

When the switch bootstrap charging circuit provided in the present embodiment works normally for charging, the low-voltage MOSFET Q1 and the high-voltage MOSFET Q2 are turned on. The charging speed of the bootstrap capacitor $C_{boot}$ is determined by the sum of the on-resistance Rds_on of the low-voltage MOSFET Q1 and the high-voltage MOSFET Q2 and the RC time constant of the bootstrap capacitor $C_{boot}$. When the bootstrap capacitor $C_{boot}$ is powered on (i.e. the process where the voltage difference of the high-side power rail is below undervoltage limit, which is judged by the UVLO_HS), the low-voltage MOSFET Q1 is selected to be turned on, the high-voltage MOSFET Q2 is turned off, and the diode of the high-voltage MOSFET Q2 is used to limit the charging current. When a negative switch node voltage occurs, the low-voltage MOSFET Q1 and the high-voltage MOSFET Q2 are turned off, and a back-to-back diode is presented between the power supply voltage VDD and the bootstrap capacitor $C_{boot}$ to block off the path between the power supply voltage VDD and the bootstrap capacitor $C_{boot}$, and thereby preventing the bootstrap capacitor $C_{boot}$ from being charged when the voltage at the power switch node SW is negative.

The undervoltage signal of the power supply voltage VDD is used as a control signal having the highest enable priority in the chip. When the power supply of the chip is abnormal, i.e., when the power supply voltage VDD is undervoltage, all the modules of the chip are turned off by the enable signal EN, including turning off the upper and lower power transistors and cutting off the bootstrap power supply path. After the undervoltage of the power supply voltage VDD is ended, the lower power transistor is first unlocked and the bootstrap path is opened, so that the bootstrap capacitor $C_{boot}$ can be slowly charged when the lower power transistor is turned on. When the voltage difference BST-SW of the high-side power rail is undervoltage (determined by UVLO_HS), the upper power transistor is completely locked to ensure that the bootstrap charging proceeds normally. After the undervoltage of the voltage difference of the high-side power rail is ended, the BST-SW is kept at the working voltage, and the upper power transistor is unlocked at this time.

After the power-on of the power supply voltage VDD and the reference voltage is completed, the enable signal EN is shifted to high level to unlock the low-voltage MOSFET Q1. When the second undervoltage signal UVLO_HS is at low level, the switching on of the low-voltage MOSFET Q1 is controlled by the first low-side control signal DRVL_FB0. When the first low-side control signal DRVL_FB0 is at high level, the low-voltage MOSFET Q1 is turned on, and when the first low-side control signal DRVL_FB0 is at low level, the low-voltage MOSFET Q1 is turned off. When the low-voltage MOSFET Q1 is turned on, the bootstrap capacitor $C_{boot}$ is charged in a current limiting charging mode by the body diode of the high-voltage MOSFET Q2. After the power-on of the voltage difference BST-SW of the high-side power rail is completed, the second undervoltage signal UVLO_HS is shifted to high level to unlock the high-voltage MOSFET Q2.

When the enable signal EN and the second undervoltage signal UVLO_HS are both at high level, the low-voltage MOSFET Q1 and the high-voltage MOSFET Q2 are both unlocked. The switching on of the low-voltage MOSFET Q1 is also controlled by the first low-side control signal DRVL_FB0. The switching on of the high-voltage MOSFET Q2 is controlled by the first low-side control signal DRVL_FB0 and the zero-voltage sensing signal ZVS_out. When the second undervoltage signal UVLO_HS, the first low-side control signal DRVL_FB0, and the zero-voltage sensing signal ZVS_out are all at high level, the high-voltage MOSFET Q2 is turned on. At this time, the charging speed of the bootstrap capacitor $C_{boot}$ is determined by the RC time constant $(Rds\_on-Q1+Rds\_on-Q2)*C_{boot}$.

Figure 9:
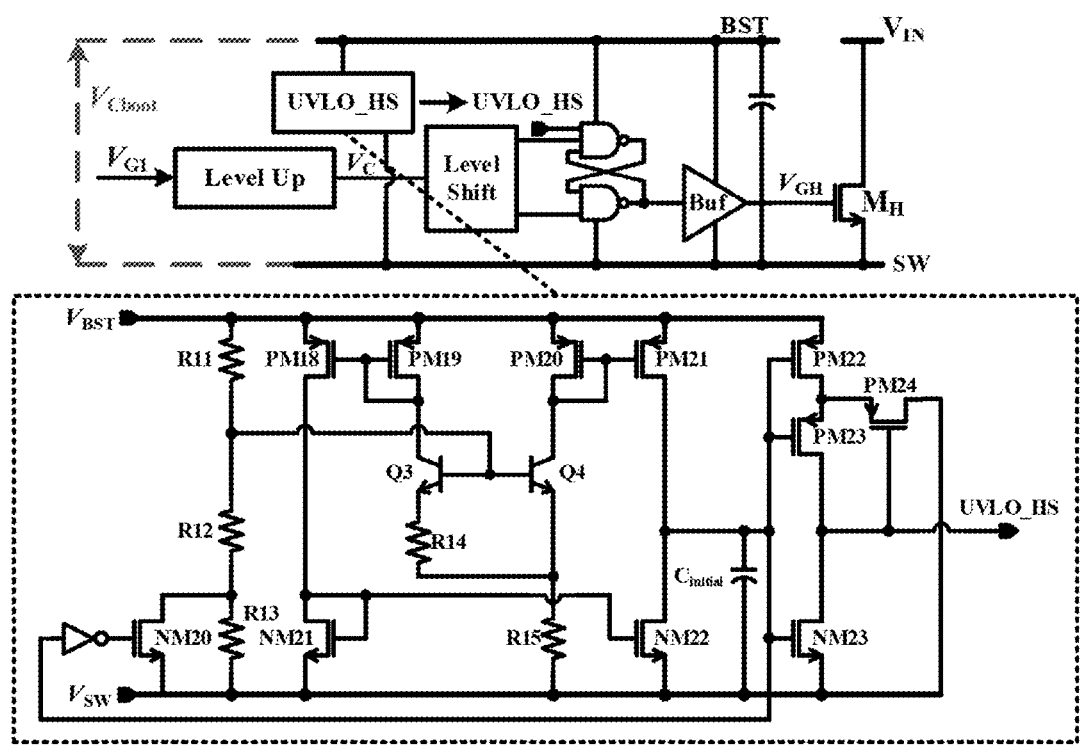
FIG. 9 is a schematic circuit diagram of a second undervoltage signal UVLO_HS obtained in embodiment 2.

FIG. 9 is a schematic form of UVLO_HS module, which generates the second under-voltage signal UVLO_HS according to the voltage between the floating power rail BST and the switch node SW. The second under voltage signal UVLO_HS is at low level when the voltage difference between the floating power rail BST and the switch node SW is below undervoltage limit. The second undervoltage signal UVLO_HS is at high level after the power-on of the voltage between the floating power rail BST and the switch node SW is completed.

The working process and working principle of the present embodiment are as follows.

When the power supply voltage VDD is undervoltage, the enable signal EN is at low level, and the low-voltage MOSFET control module, the zero-voltage sensing module, and the high-voltage switching logic control module do not work. The gate drive signal GP of the low-voltage MOSFET and the gate drive signal GN of the high-voltage MOSFET are at a high level to turn off the low-voltage MOSFET Q1 and the high-voltage MOSFET Q2, so that the switching bootstrap charging path is cut off to not charge the bootstrap capacitor $C_{boot}$. After a success power on of the power supply voltage VDD, the enable signal EN is at high level to enable the low-voltage MOSFET control module, the zero-voltage sensing module, and the high-voltage switching logic control module.

When the power on of the power supply voltage VDD is completed, the enable signal EN is at high level. First, the lower power transistor is unlocked, the low-voltage MOSFET control module generates a gate drive signal GP of the low-voltage MOSFET at a low level to turn on the low-voltage MOSFET Q1 when the first low-side control signal DRVL_FB0 is at a high level, and the bootstrap path is opened to allow the bootstrap capacitor $C_{boot}$ to get charged slowly when the lower power transistor is turned on. Then, the second undervoltage signal UVLO_HS can be obtained according to whether the undervoltage between the floating power rail BST and the switch node SW is presented. The second undervoltage signal UVLO_HS is at a low level when there is an undervoltage between the floating power rail, i.e. the voltage difference between the output terminal BST of the switch bootstrap charging circuit, and the switch node SW. The high-voltage switching logic control module is controlled to generate a gate drive signal GN of the high-voltage MOSFET at a high level to turn off the high-voltage MOSFET Q2. Therefore, when the power on of the power supply voltage VDD is completed and there is the undervoltage between the floating power rail BST and the switch node SW, the low-voltage MOSFET Q1 is turned on, the high-voltage MOSFET Q2 is turned off, and the bootstrap capacitor $C_{boot}$ is charged in the current limiting charging mode by the body diode of the high-voltage MOSFET Q2.

When the power on of the power supply voltage VDD is completed, and the power on between the floating power rail BST and the switch node SW is also completed, the enable signal EN and the second undervoltage signal UVLO_HS are both at a high level. The low-voltage MOSFET control module controls the low-voltage MOSFET Q to be turned on or off according to the first low-side control signal DRVL_FB0. The high-voltage switching logic control module controls the high-voltage MOSFET Q2 to be turned on or off according to the zero-voltage sensing signal ZVS_out, the first low-side control signal DRVL_FB0, and the second under-voltage signal UVLO_HS.

When the first low-side control signal DRVL_FB0 is at a low level, the gate drive signal GP of the low-voltage MOSFET and the gate drive signal GN of the high-voltage MOSFET are both at a high level. Therefore, after the power on of the power supply voltage VDD and the power on of the voltage between the floating power rail BST and the switch node SW, even if a negative voltage occurs at the switch node SW during the dead time, the low-voltage MOSFET Q1 and the high-voltage MOSFET Q2 will both be turned off to form the back-to-back diode between the power supply voltage VDD and the bootstrap capacitor $C_{boot}$. Thus, the path between the power supply voltage VDD and the bootstrap capacitor $C_{boot}$ is cut off, and the case where the bootstrap capacitor $C_{boot}$ gets charged when the voltage at the switch node SW is negative can be avoided. When the switch node SW has a high voltage, the zero-voltage sensing signal ZVS_out is at low level, so that a gate drive signal GN of the high-voltage MOSFET at a high level is generated to turn off the high-voltage MOSFET Q2. At this time, even if the lower power transistor is turned on and the DRVL_FB0 is at a low level, the BST high voltage caused by the high voltage of the SW is stopped by the body diode of the high-voltage MOSFET Q2 to avoid influence on the circuits of the low-voltage MOSFET Q1 and other low-voltage domains.

When the first low-side control signal DRVL_FB0 is at a high level, the gate drive signal GP of the low-voltage MOSFET is at a low level to turn on the low-voltage MOSFET Q1, the voltage at the switch node SW is approximately reduced to 0 (the actual value is related to the load current $I_{Load}$ and the lower transistor on-resistance $R_{ds\_on}$, which equals to $-I_{Load}*R_{ds\_on}$), so that the zero-voltage sensing signal ZVS_out is at a high level to generate the gate drive signal GN of the high-voltage MOSFET at low level to turn on the high-voltage MOSFET Q2. Therefore, when the power on of the power supply voltage VDD is completed, the power on of the voltage between the floating power rail BST and the switch node SW is also completed, and the voltage at the switch node SW is 0, the low-voltage MOSFET Q1 and the high-voltage MOSFET Q2 are turned on, the bootstrap charging circuit works normally. The charging speed of the bootstrap capacitor $C_{boot}$ is determined by the sum of the on-resistance Rds_on of the low-voltage MOSFET Q1 and the high-voltage MOSFET Q2, and the RC time constant of the bootstrap capacitor $C_{boot}$.

The truth table of the circuit's working process (partial) of the various logic signals is as follows.

charged. After the power on of the power supply voltage VDD succeeds, and if the BST-SW is undervoltage, the low-voltage MOSFET Q1 is turned on, the high-voltage MOSFET Q2 is turned off, and the bootstrap capacitor $C_{boot}$ gets charged in the current limiting charging mode. If the power on of the power supply voltage VDD and BST-SW both succeed, and the switch node SW has high voltage, the high-voltage MOSFET Q2 is turned off to block the high voltage on the BST node. If the voltage at the switch node SW approximates 0, the low-voltage MOSFET Q1 and the high-voltage MOSFET Q2 are turned on, and the bootstrap charging circuit works normally. The bootstrap charging circuit of the present invention charges the bootstrap capacitor $C_{boot}$ when the lower power transistor is turned on to avoid the case where the $C_{boot}$ is overcharged at the negative voltage of SW. The low-voltage MOSFET Q1 is configured to cut off the path between the power supply voltage VDD to the bootstrap capacitor $C_{boot}$ when the negative voltage of SW occurs. By replacing the bootstrap diode with the second MOSFET Q2, the problem of reverse recovery loss of the bootstrap diode and degradation of high-frequency load performance can be eliminated. Moreover, since the PMOS transistor is used, the problem of malfunctions caused because the gate control signal is affected by the voltage crosstalk at the switch node SW will not happen.

It should be noted that, the system control method and the specific circuit design used in the present embodiment may further be applied to the drive circuit of the Si power switch device and other wide bandgap semiconductor power switch devices (such as SiC power switch devices). Specifically, for the gate drive circuit of the Si power switch devices, the body diode of the lower power transistor would conduct to sustain the current of inductance in dead time, the voltage at the switch node SW drops to a negative voltage of −0.7V or even more negative in heavy-load case due to the impact of the body diode's parasitic resistance. The present invention is suitable for such applications as well.

Various other specific modifications and combinations may be made by those of ordinary skill in the art according to the suggestions disclosed by the present invention without

| DRVL_FB0 | EN | GP | ZVS_out | UVLO_HS | GN | Corresponding circuit state |
| --- | --- | --- | --- | --- | --- | --- |
| / | 0 | 1 | / | / | 1 | Internal power supply is undervoltage, and bootstrap charging path is locked. |
| 1 | 1 | 0 | / | 0 | 1 | Internal power supply is powered on, BST-SW is undervoltage, and $C_{boot}$ is charged in current limiting charging mode. |
| 0 | 1 | 1 | 0 | 1 | 1 | The internal power supply and BST-SW are powered on, SW is at high voltage, and high-voltage switch is locked. |
| 1 | 1 | 0 | 1 | 1 | 0 | The internal power supply is powered on, the BST-SW is powered on, the voltage of SW approximates 0, and the high-voltage switch is unlocked. |

In summary, the present embodiment provides a dual switching bootstrap charging scheme according to the physical characteristics of the bootstrap diode of the conventional bootstrap scheme. When the power supply voltage VDD is undervoltage, all modules of the bootstrap charging circuit are turned off, and the bootstrap capacitor $C_{boot}$ does not get departing from the essence of the present invention, these modifications and combinations should still be considered as falling within the scope of the present invention.

What is claimed is:

1. A switch bootstrap charging circuit suitable for a gate drive circuit of a GaN power device, wherein, the GaN power devices comprises an upper power transistor and a lower power transistor, the switch bootstrap charging circuit comprising:

a low-voltage metal-oxide-semiconductor field effect transistor (MOSFET), a high-voltage MOSFET, a high-voltage MOSFET control module, and a low-voltage MOSFET control module, wherein the low-voltage MOSFET is a first PMOS transistor, and the high-voltage MOSFET is a first NMOS transistor configured to withstand a high drain-to-source (VDS) voltage;

the low-voltage MOSFET control module generates a first control signal and a gate drive signal of the low-voltage MOSFET according to a first undervoltage signal and a gate drive signal of the lower power transistor, wherein, the first undervoltage signal is an undervoltage protection signal generated during a power on of a power supply voltage;

when the first undervoltage signal is at a low level, the first control signal and the gate drive signal of the low-voltage MOSFET are at the low level; when the first undervoltage signal is at a high level, the first control signal and the gate drive signal of the lower power transistor are at a same logic level, and the gate drive signal of the low-voltage MOSFET and the gate drive signal of the lower power transistor are at reverse logic levels;

a gate of the low-voltage MOSFET is connected to the gate drive signal of the low-voltage MOSFET, a source of the low-voltage MOSFET is connected to the power supply voltage, and a drain of the low-voltage MOSFET is connected to a source of the high-voltage MOSFET;

the high-voltage MOSFET control module comprises a second NMOS transistor, a first inverter, a second inverter, a first capacitor, a second capacitor, and a first diode;

an input terminal of the first inverter is connected to the first control signal, and an output terminal of the first inverter is connected to an input terminal of the second inverter, and the output terminal of the first inverter is connected to a cathode of the first diode and a gate of the second NMOS transistor through the first capacitor;

an anode of the first diode and a source of the second NMOS transistor are connected to the power supply voltage; and a gate of the high-voltage MOSFET is connected to a drain of the second NMOS transistor, the gate of the high-voltage MOSFET is connected to the output terminal of the second inverter through the second capacitor, and a drain of the high-voltage MOSFET serves as an output terminal of the switch bootstrap charging circuit.

2. A switch bootstrap charging circuit suitable for a gate drive circuit of a GaN power device, wherein, the GaN power device comprises an upper power transistor and a lower power transistor, the switch bootstrap charging circuit comprising:

a low-voltage MOSFET, a high-voltage MOSFET, a bootstrap capacitor, a high-voltage MOSFET control module, and a low-voltage MOSFET control module, wherein the low-voltage MOSFET is a PMOS transistor, and the high-voltage MOSFET is a high-voltage PMOS transistor;

a source of the low-voltage MOSFET is connected to a power supply voltage, a drain of the low-voltage MOSFET is connected to a drain of the high-voltage MOSFET, and a gate of the low-voltage MOSFET is connected to a gate drive signal of the low-voltage MOSFET;

a gate of the high-voltage MOSFET is connected to a gate drive signal of the high-voltage MOSFET, a source of the high-voltage MOSFET is connected to an upper electrode plate of the bootstrap capacitor, and the source of the high-voltage MOSFET serves as an output terminal of the switch bootstrap charging circuit;

a lower electrode plate of the bootstrap capacitor is connected to a switch node of the gate drive circuit of the GaN power devices;

the low-voltage MOSFET control module is enabled by an enable signal to generate the gate drive signal of the low-voltage MOSFET under a control of a first low-side control signal; the gate drive signal of the low-voltage MOSFET and the first low-side control signal are at reverse logic levels; the first low-side control signal and a gate drive signal of the lower power transistor are at a first same logic level; the enable signal and the first undervoltage signal are at a second same logic level; and the first undervoltage signal is an undervoltage signal of the power supply voltage;

the high-voltage MOSFET control module comprises a zero-voltage sensing module, a high-voltage switching logic control module, and a high-voltage level-shift module;

the zero-voltage sensing module is enabled by the enable signal, and the zero-voltage sensing module samples a signal at a switch node of the gate drive circuit of the GaN power devices under a control of a second low-side control signal and generates a zero-voltage sensing signal; if the signal at the switch node of the gate drive circuit of the GaN power devices has a high voltage, the zero-voltage sensing signal is at a first low level; if the signal at the switch node of the gate drive circuit of the GaN power devices is essentially zero, the zero-voltage sensing signal is at a high level;

the second low-side control signal and the gate drive signal of the lower power transistor are at a third same logic level, and the second low-side control signal is obtained by delaying the first low-side control signal;

the high-voltage switching logic control module is enabled by the enable signal for generating a determination signal according to the zero-voltage sensing signal and the first low-side control signal;

the high-voltage level-shift module is configured to shift a power rail of the determination signal from power supply voltage to ground to output terminal signal of the switch bootstrap charging circuit to the signal at the switch node;

the high-voltage switching logic control module generates the gate drive signal of the high-voltage MOSFET according to the determination signal processed by the high-voltage level-shift module and the second undervoltage signal; the gate drive signal of the high-voltage MOSFET is at a second low level only when the second undervoltage signal, the first low-side control signal, and the zero-voltage sensing signal are all at the high level; otherwise, the gate drive signal of the high-voltage MOSFET is at the high level; and the second undervoltage signal is an undervoltage signal between the output terminal of the switch bootstrap charging circuit and the switch node.

3. The switch bootstrap charging circuit suitable for the gate drive circuit of the GaN power device of claim 2, wherein, the zero-voltage sensing module comprises a third inverter, a first resistor, a second resistor, a third resistor, a fourth resistor, a fifth resistor, a sixth resistor, a seventh resistor, an eighth resistor, a ninth resistor, a tenth resistor, a twenty-sixth NMOS transistor, a twenty-seventh NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a twelfth NMOS transistor, a thirteenth NMOS transistor, a fourteenth NMOS transistor, a fifteenth NMOS transistor, a sixteenth NMOS transistor, a seventeenth NMOS transistor, an eighteenth NMOS transistor, a nineteenth NMOS transistor, a twentieth NMOS transistor, a twenty-first NMOS transistor, a twenty-second NMOS transistor, a twenty-third NMOS transistor, a twenty-fourth NMOS transistor, a twenty-fifth NMOS transistor, an eighteenth PMOS transistor, a second PMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a tenth PMOS transistor, an eleventh PMOS transistor, a twelfth PMOS transistor, a thirteenth PMOS transistor, a fourteenth PMOS transistor, a fifteenth PMOS transistor, a sixteenth PMOS transistor, and a seventeenth PMOS transistor, wherein, the twenty-fifth NMOS transistor is a high voltage transistor;

one end of the tenth resistor is connected to the switch node of the gate drive circuit of the GaN power devices, and an other end of the tenth resistor is connected to a drain of the twenty-fifth NMOS transistor;

a gate of the twentieth NMOS transistor is connected to gates of the twenty-fifth NMOS transistor and the twenty-first NMOS transistor and the gate of the twentieth NMOS transistor is connected to the second low-side control signal, a source of the twentieth NMOS transistor is connected to a source of the twenty-fifth NMOS transistor, and a drain of the twentieth NMOS transistor is connected to a source of the twenty-first NMOS transistor and a drain of the twenty-fourth NMOS transistor;

a drain of the twenty-first NMOS transistor is connected to a drain of the twenty-third NMOS transistor and outputs a sampling signal;

a gate of the twenty-second NMOS transistor is connected to gates of the twenty-third NMOS transistor and the twenty-fourth NMOS transistor and the gate of the twenty-second NMOS transistor is connected to a level-reversed signal of the second low-side control signal, a drain of the twenty-second NMOS transistor is connected to a first reference voltage, and a source of the twenty-second NMOS transistor is connected to a source of the twenty-third NMOS transistor;

a source of the twenty-fourth NMOS transistor is grounded;

a gate of the sixteenth PMOS transistor is connected to the sampling signal, a source of the sixteenth PMOS transistor is connected to a source of the seventeenth PMOS transistor, the source of the sixteenth PMOS transistor is connected to a drain of the fifth PMOS transistor through the third resistor, and a drain of the sixteenth PMOS transistor is connected to a source of the eighth NMOS transistor and a drain of the ninth NMOS transistor;

a gate of the seventeenth PMOS transistor is connected to a second reference voltage, and a drain of the seventeenth PMOS transistor is connected to a source of the tenth NMOS transistor and a drain of the eleventh NMOS transistor, a source of the fifth PMOS transistor is connected to a drain of the sixth PMOS transistor;

a gate of the ninth NMOS transistor is connected to a gate of the eleventh NMOS transistor;

a gate of the eighth NMOS transistor is connected to a gate of the tenth NMOS transistor, a drain of the eighth NMOS transistor is connected to a gate of the twelfth NMOS transistor, and the drain of the eighth NMOS transistor is connected to a gate and a drain of the seventh PMOS transistor through the fourth resistor;

one end of the fifth resistor is connected to a gate of the seventh PMOS transistor, and an other end of the fifth resistor is connected to a drain of the tenth NMOS transistor and a gate of the thirteenth NMOS transistor;

a gate of the twenty-sixth NMOS transistor is connected to a level-reversed signal of the first undervoltage signal, a drain of the twenty-sixth NMOS transistor is connected to a gate of the third NMOS transistor, a gate and a drain of the twenty-seventh NMOS transistor, and a bias signal, a source of the twenty-sixth NMOS transistor is connected to sources of the twenty-seventh NMOS transistor, the third NMOS transistor, the fifth NMOS transistor, the seventh NMOS transistor, the ninth NMOS transistor, the eleventh NMOS transistor, the fifteenth NMOS transistor, the sixteenth NMOS transistor, and the seventeenth NMOS transistor, and is grounded;

a gate of the second PMOS transistor is connected to gates of the third PMOS transistor, the fifth PMOS transistor, and the tenth PMOS transistor, and a drain of the third NMOS transistor, and the gate of the second PMOS transistor is connected to a drain of the second PMOS transistor and gates of the eighteenth PMOS transistor, the fourth PMOS transistor, the sixth PMOS transistor, and the ninth PMOS transistor through the first resistor, and a source of the second PMOS transistor is connected to a drain of the eighteenth PMOS transistor;

a drain of the fourth PMOS transistor is connected to a source of the third PMOS transistor, and a source of the fourth PMOS transistor is connected to sources of the eighteenth PMOS transistor, the sixth PMOS transistor, the seventh PMOS transistor, the eighth PMOS transistor, the ninth PMOS transistor, the eleventh PMOS transistor, and the fourteenth PMOS transistor, and is connected to the power supply voltage;

a gate of the fourth NMOS transistor is connected to gates of the sixth NMOS transistor and the fourteenth NMOS transistor and a drain of the third PMOS transistor, and the gate of the fourth NMOS transistor is connected to a drain of the fourth NMOS transistor and gates of the fifth NMOS transistor, the seventh NMOS transistor, and the fifteenth NMOS transistor through the second resistor, and a source of the fourth NMOS transistor is connected to a drain of the fifth NMOS transistor;

a source of the fourteenth NMOS transistor is connected to a drain of the fifteenth NMOS transistor, and a drain of the fourteenth NMOS transistor is connected to sources of the twelfth NMOS transistor and the thirteenth NMOS transistor;

one end of the sixth resistor is connected to a gate and a drain of the eighth PMOS transistor and one end of the seventh resistor, and an other end of the sixth resistor is connected to a drain of the twelfth NMOS transistor and gates of the thirteenth PMOS transistor and the eighteenth NMOS transistor;

a gate of the twelfth PMOS transistor is connected to an other end of the seventh resistor, a drain of the thirteenth NMOS transistor, and a gate of the nineteenth NMOS transistor; a source of the twelfth PMOS transistor is connected to a source of the thirteenth PMOS transistor and a drain of the tenth PMOS transistor; a drain of the twelfth PMOS transistor is connected to a gate and a drain of the sixteenth NMOS transistor, and the drain of the twelfth PMOS transistor is connected to a drain of the thirteenth PMOS transistor and a gate of the seventeenth NMOS transistor through the eighth resistor;

a source of the tenth PMOS transistor is connected to a drain of the ninth PMOS transistor;

a gate of the fourteenth PMOS transistor is connected to a drain of the eighteenth NMOS transistor, and the gate of the fourteenth PMOS transistor is connected to a gate and a drain of the eleventh PMOS transistor and a drain of the nineteenth NMOS transistor through the ninth resistor; a drain of the fourteenth PMOS transistor is connected to drains of the seventeenth NMOS transistor and the fifteenth PMOS transistor and an input terminal of the third inverter;

a drain of the sixth NMOS transistor is connected to sources of the eighteenth NMOS transistor and the nineteenth NMOS transistor, and a source of the sixth NMOS transistor is connected to a drain of the seventh NMOS transistor, a gate of the fifteenth PMOS transistor is connected to the enable signal, and a source of the fifteenth PMOS transistor is connected to the power supply voltage; and an output terminal of the third inverter outputs the zero-voltage sensing signal.

\* \* \* \* \*